United States Patent
Connell et al.

(10) Patent No.: US 9,823,286 B2
(45) Date of Patent: Nov. 21, 2017

(54) MOISTURE DETECTION SYSTEM FOR EXTERNAL ELECTRICAL CONNECTOR AND METHODS THEREFOR

(71) Applicant: Motorola Mobility LLC, Chicago, IL (US)

(72) Inventors: Nathan M Connell, Glenview, IL (US); James Bender, Cary, IL (US); Ernest Sirois, Crystal Lake, IL (US)

(73) Assignee: Motorola Mobility LLC, Chicago, IL (US)

( * ) Notice: Subject to any disclaimer, the term of this patent is extended or adjusted under 35 U.S.C. 154(b) by 165 days.

(21) Appl. No.: 14/696,626

(22) Filed: Apr. 27, 2015

(65) Prior Publication Data

US 2016/0313270 A1    Oct. 27, 2016

(51) Int. Cl.
*G01R 31/04* (2006.01)
*G01R 31/00* (2006.01)

(52) U.S. Cl.
CPC ........... *G01R 31/00* (2013.01); *G01R 31/045* (2013.01); *G01R 31/003* (2013.01)

(58) Field of Classification Search
USPC ....... 324/694, 693, 691, 649, 600, 538, 664, 324/601; 340/604, 517; 439/620.21; 307/118, 125; 73/861.41
See application file for complete search history.

(56) References Cited

U.S. PATENT DOCUMENTS

| | | | |
|---|---|---|---|
| 6,377,181 B1 * | 4/2002 | Kroll | E04B 1/70 340/602 |
| 6,603,319 B1 | 8/2003 | Kasahara et al. | |
| 6,683,535 B1 | 1/2004 | Utke | |
| 7,604,512 B1 | 10/2009 | Chen | |
| 7,771,215 B1 | 8/2010 | Ni et al. | |
| 7,798,853 B2 | 9/2010 | Shi et al. | |
| 7,880,591 B2 | 2/2011 | Johnson et al. | |
| 7,884,620 B2 * | 2/2011 | Campbell | G01N 27/223 324/644 |
| 7,927,145 B1 | 4/2011 | Chang | |
| 8,063,765 B2 | 11/2011 | Johnson et al. | |
| 8,482,305 B2 | 7/2013 | Johnson | |
| 8,777,672 B2 | 7/2014 | Chung et al. | |
| 2009/0195394 A1 | 8/2009 | Johnson et al. | |
| 2013/0052848 A1 * | 2/2013 | Sloey | H01R 13/52 439/271 |
| 2013/0242475 A1 * | 9/2013 | Sloey | H01R 13/5202 361/679.01 |
| 2014/0313039 A1 * | 10/2014 | Stevens | H03K 17/94 340/604 |

* cited by examiner

*Primary Examiner* — Melissa Koval
*Assistant Examiner* — Nasima Monsur
(74) *Attorney, Agent, or Firm* — Philip H. Burrus, IV

(57) ABSTRACT

An electronic device includes a housing and an electrical connector disposed along the housing. The electrical connector includes one or a plurality of electrical contacts having at least a portion thereof exposed to an exterior of the housing. An interface circuit is operable with the electrical connector and coupled to one or more electrical contacts of the electrical connector to interact with a complementary connector when connected to the electrical connector. A moisture detection circuit is to detect moisture contacting the electrical connector.

20 Claims, 9 Drawing Sheets

MOISTURE DETECTION SYSTEM FOR EXTERNAL ELECTRICAL CONNECTOR AND METHODS THEREFOR

BACKGROUND

Technical Field

This disclosure relates generally to electronic devices, and more particularly to electronic devices having connectors.

Background Art

Mobile electronic communication devices, such as mobile telephones, smart phones, gaming devices, and the like, are used by billions of people. These owners use mobile communication devices for many different purposes including, but not limited to, voice communications and data communications for text messaging, Internet browsing, commerce such as banking, and social networking.

As the technology of these devices has advanced, their use in everyday life has become more entrenched. For example, not too long ago people only used telephones to make voice calls indoors when at home or in the office. Today, mobile devices allow people to make voice calls in all sorts of environments. With wireless accessories for these mobile devices, a person may make a call while standing in the rain, running a marathon, or commuting on a train.

The desire to be able to use these devices in all sorts of environments presents challenges. For instance, most mobile electronic devices have internally disposed rechargeable batteries. A user charges these batteries by connecting a charger or power supply to a connector disposed along the device. Connectors have electrically conductive terminals, which are generally made of metal. Metal can corrode in wet environments. However, rain, perspiration, and other moisture are frequently present in many environments in which mobile devices are used.

It would be advantageous to have a system and method to facilitate improved electronic device performance in environments where moisture is present.

Figure 1:
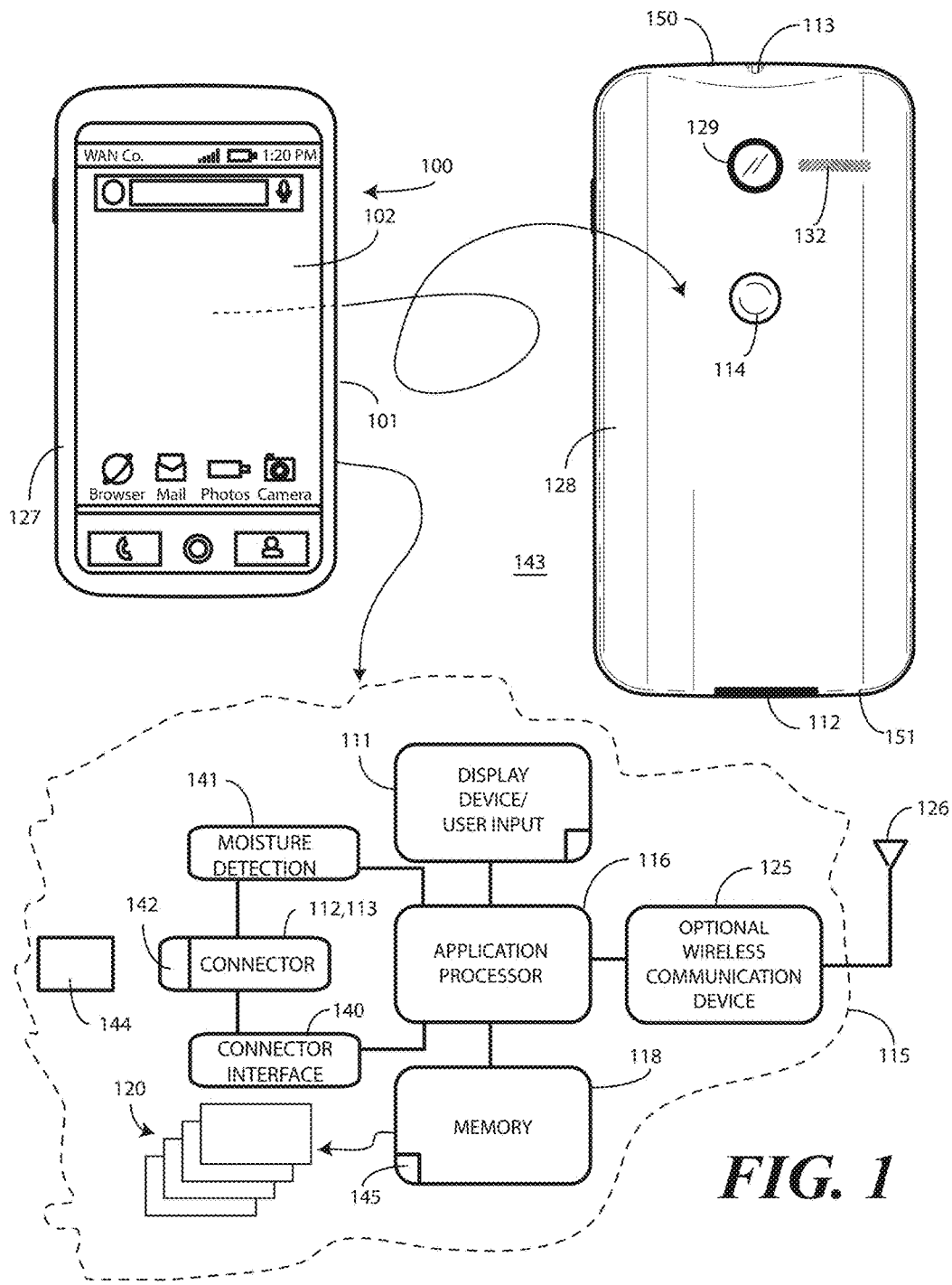
FIG. 1 illustrates one explanatory electronic device in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to detecting moisture in an external electrical connector with a moisture detection circuit. Any process descriptions or blocks in flow charts should be understood as representing modules, segments, or portions of code that include one or more executable instructions for implementing specific logical functions or steps in the process. Alternate implementations are included, and it will be clear that functions may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

It will be appreciated that embodiments of the disclosure described herein may be comprised of one or more conventional processors and unique stored program instructions that control the one or more processors to implement, in conjunction with certain non-processor circuits, some, most, or all of the functions of moisture detection, providing alert notifications, and/or connector operation modification described herein. The non-processor circuits may include, but are not limited to, a processor, signal conversion circuits, switches, signal drivers, clock circuits, comparators and signal level detection circuits, power source circuits, and user input devices. As such, these functions may be interpreted as steps of a method to perform detect moisture in a connector using a combination of an interface circuit and a moisture detection circuit as described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. As used herein, components may be "operatively coupled" when information can be sent between such components, even though there may be one or more intermediate or intervening components between, or along the connection path. Also, reference designators shown herein in parenthesis indicate components shown in a figure other than the one in discussion. For example, talking about a device (10) while discussing figure A would refer to an element, 10, shown in figure other than figure A.

The presence of water or other conductive contamination in a connector of an electronic device, when such a condition goes without remediation, can lead to permanent accessory malfunction and frustrating user experiences. However, when water or other contaminants come into contact with terminals or electrical contacts, not all failures due to corrosion or other damage are permanent. Some malfunctions can be more transient and benign in nature. For example, when a connector suffers from benign contamination or corrosion, circuitry operable with that connector may misidentify an attached accessory due to the presence of a contaminant.

In some cases, the transient malfunction can be corrected when the contaminant is removed. Where this is the case, long-term damage may not occur. However, even fleeting and transient device malfunction can be frustrating and confusing to an end user.

Where large currents pass through terminals or electrical contacts, as is the case when a connector is a charging port, embodiments of the disclosure contemplate that water contamination can lead to permanent device damage. Illustrating by example, when a voltage is applied to an electrical contact in the presence of water, the water will react with the metal of the contact, which leads to irreversible corrosion of the connector. This corrosion can cause increased contact electrical impedance, reduced charging efficiency, increased heat generation during charging, and other generally undesirable consequences. Where the water in the connector is wet saltwater or partially dry saltwater, dendritic growth can occur between connector contacts leading to total loss of connector and/or device functionality.

Some manufacturers attempt to prevent corrosion by including rubber seals, covers, grommets, or other mechanical elements that insert in, and at least partially seal, connectors. These elements "plug" the connector when it is not connected to a charger in an attempt to prevent moisture from coming into contact with the metal terminals. These mechanical solutions are frequently unsightly, clunky, and cumbersome. Moreover, they are easy to misplace. Tethers coupling these mechanical devices to the mobile device frequently tear or become unreliable.

Embodiments of the present disclosure work to prevent such failures by providing a connector, which can be mounted on an external surface of an electronic device, that is operable with a moisture detection circuit and non-moisture detection circuit such as a charging or other power circuit. In one embodiment, the moisture detection circuit is used to monitor an electrical impedance between two adjacent electrical contacts of this connector. For example, in one embodiment where the connector is a Universal Serial Bus (USB) connector, the moisture detection circuit monitors the impedance between the VBUS electrical contact and its adjacent contact. Monitoring impedance between these two contacts is advantageous because the VBUS electrical contact is the connector coupling voltage between a power supply and the electrical device in charging applications. As will be described below, other electrical contacts can be monitored in other applications.

In one or more embodiments, when the impedance between the VBUS contact and its adjacent contact changes from a predetermined nominal value, the moisture detection circuit can detect this impedance change via an analog-to-digital converter. When this occurs, in one embodiment the moisture detection circuit can deliver a notification to the central processor or control circuit of the device and/or the user interface of the device. This can alert a user that moisture has entered the connector, which is a condition that needs to be remediated to prevent corrosion.

In other embodiments, the moisture detection circuit monitors the electrical impedance between an electrical contact and an electrically conductive shroud of a connector. For example, in one embodiment where the connector is a micro-USB (uUSB) connector, the moisture detection circuit can monitor an impedance between a selected electrical contact of the connector and the metal housing disposed about the electrical contacts. When this impedance changes from a predefined nominal amount, the moisture detection circuit can deliver alerts and notifications as described in the preceding paragraph.

It is well to note that in one or more embodiments, the moisture detection circuit works in tandem with an interface circuit responsible for the connector's normal operation. In this regard, the moisture detection circuit can be thought of as a pilot fish alongside the shark that is the interface circuit. This distinction is different from prior art designs where moisture detection was separate and distinct from connectors and their interface circuits. For example, many prior art designs include a detection circuit that is a standalone unit disposed inside an electronic device. Such is not the case here. In one or more embodiments the moisture detection circuit works in parallel with the interface circuit at a common connector to both detect moisture and operate the connector. This results in a more efficient, compact, and less expensive solution than that found in prior art designs. Embodiments of the disclosure can also be used with external contacts, thereby eliminating the need for mechanical solutions such as plugs, tethers, and the like.

In one or more embodiments an electronic device includes a housing. The housing includes an electrical connector disposed along the housing. In one embodiment, the electrical connector comprises a plurality of electrical contacts having at least a portion thereof exposed to an exterior of the housing.

In one embodiment, an interface circuit is operable with the electrical connector and coupled to one or more electrical contacts of the electrical connector. The interface is to interact with a complementary connector when connected to the electrical connector. For example, if the interface circuit is a charging circuit for a rechargeable battery disposed within the electronic device, the interface circuit may be operable to receive energy from a power supply when the power supply is coupled to the connector.

In one embodiment, a moisture detection circuit is coupled to at least one electrical contact of the electrical connector. The moisture detection circuit is operable to detect moisture contacting the electrical connector. In one embodiment, this occurs by applying a voltage with a driver to the electrical contact. Application of the voltage can occur on a periodic basis. A detector then senses a detected voltage, with the difference of applied voltage and detected voltage being a function of the impedance between either the electrical contact and another electrical contact or the electrical contact and a shroud of the electrical connector. Where the difference in voltage is greater than a predetermined threshold, the detector interprets this as due to an impedance reduction from water coming into contact with the connector. In one or more embodiments, the detector can determine whether the water is fresh water or saltwater as a function of impedance.

When this occurs, at least one or more processors operable with the moisture detection circuit are to execute at least one operation when the moisture detection circuit detects the moisture contacting the electrical connector. Examples of operations include delivering a moisture detection notification to a user interface, suspending interface circuit operation with the complementary connector coupled to the connector, or recording an occurrence of moisture detection in a memory of the electronic device. These operations are explanatory only. Others will be obvious to those of ordinary skill in the art having the benefit of this disclosure. Embodiments of the disclosure advantageously allow an electronic device to be designed that will withstand thirty minutes in fresh water without degradation, and without the use of a grommet or other plug to cover the connector while in water.

Turning now to FIG. 1, illustrated therein is one explanatory electronic device 100 configured in accordance with one or more embodiments of the disclosure. The electronic device 100 of FIG. 1 is a portable electronic device, and is shown as a smart phone for illustrative purposes. However, it should be obvious to those of ordinary skill in the art having the benefit of this disclosure that other electronic devices may be substituted for the explanatory smart phone of FIG. 1. For example, the electronic device 100 could equally be a palm-top computer, a gaming device, a media player, or other device. As will be shown in FIGS. 2-3 below, the electronic device can also be a tablet device or a wearable device.

This illustrative electronic device 100 includes a display 102, which may optionally be touch-sensitive. In one embodiment where the display 102 is touch-sensitive, the display 102 can serve as a primary user interface 111 of the electronic device 100. Users can deliver user input to the display 102 of such an embodiment by delivering touch input from a finger, stylus, or other objects disposed proximately with the display. In one embodiment, the display 102 is configured as an active matrix organic light emitting diode (AMOLED) display. However, it should be noted that other types of displays, including liquid crystal displays, would be obvious to those of ordinary skill in the art having the benefit of this disclosure.

The explanatory electronic device 100 of FIG. 1 includes a housing 101. In one embodiment, the housing 101 includes two housing members. A front housing member 127 is disposed about the periphery of the display 102 in one embodiment. The front housing member 127 and the display 102 define, collectively, a first major face of the electronic device 100. A rear-housing member 128 forms the backside of the electronic device 100 in this illustrative embodiment and defines a second, rear major face of the electronic device.

Features can be incorporated into the housing members 127,128. Examples of such features include an optional camera 129 or an optional speaker port 132 disposed atop a loudspeaker. These features are shown being disposed on the rear major face of the electronic device 100 in this embodiment, but could be located elsewhere. In this illustrative embodiment, a user interface component 114, which may be a button or touch sensitive surface, can also be disposed along the rear-housing member 128.

In one embodiment, the electronic device 100 includes one or more connectors 112,113, which can include an analog connector, a digital connector, or combinations thereof. In this illustrative embodiment, connector 112 is an analog connector disposed on a first end 150, i.e., the top end, of the electronic device 100, while connector 113 is a digital connector disposed on a second end 151 opposite the first end 150, which is the bottom end in this embodiment.

The connectors 112,113 can be any of a number of connector types. These connector types include audio connectors, memory card connectors, subscriber identification module card connectors, standard USB connectors, Type-A USB connectors, Type-B USB connectors, Type-C USB connectors, some of which are referred to as uUSB connectors or mini-USB (mUSB) connectors, power supply connectors, or accessory device connectors. These connector types are illustrative only, as others will be obvious to those of ordinary skill in the art having the benefit of this disclosure. In this illustrative embodiment, connector 112 is a headset jack connector to deliver analog audio to an accessory. Connector 113 is a uUSB connector.

A block diagram schematic 115 of the electronic device 100 is also shown in FIG. 1. In one embodiment, the electronic device 100 includes one or more processors 116. In one embodiment, the one or more processors 116 can include an application processor and, optionally, one or more auxiliary processors. One or both of the application processor or the auxiliary processor(s) can include one or more processors. One or both of the application processor or the auxiliary processor(s) can be a microprocessor, a group of processing components, one or more ASICs, programmable logic, or other type of processing device.

The application processor and the auxiliary processor(s) can be operable with the various components of the electronic device 100. Each of the application processor and the auxiliary processor(s) can be configured to process and execute executable software code to perform the various functions of the electronic device 100. A storage device, such as memory 118, can optionally store the executable software code used by the one or more processors 116 during operation.

In this illustrative embodiment, the electronic device 100 also includes a communication circuit 125 that can be configured for wired or wireless communication with one or more other devices or networks. The networks can include a wide area network, a local area network, and/or personal area network. Examples of wide area networks include GSM, CDMA, W-CDMA, CDMA-2000, iDEN, TDMA, 2.5 Generation 3GPP GSM networks, 3rd Generation 3GPP WCDMA networks, 3GPP Long Term Evolution (LTE) networks, and 3GPP2 CDMA communication networks, UMTS networks, E-UTRA networks, GPRS networks, iDEN networks, and other networks.

The communication circuit 125 may also utilize wireless technology for communication, such as, but are not limited to, peer-to-peer or ad hoc communications such as HomeRF, Bluetooth and IEEE 802.11 (a, b, g or n), and other forms of wireless communication such as infrared technology. The communication circuit 125 can include wireless communication circuitry, one of a receiver, a transmitter, or transceiver, and one or more antennas 126.

In one embodiment, the one or more processors 116 can be responsible for performing the primary functions of the electronic device 100. For example, in one embodiment the one or more processors 116 comprise one or more circuits operable with one or more user interface devices 111, which can include the display 102, to present presentation information to a user. The executable software code used by the one or more processors 116 can be configured as one or more modules 120 that are operable with the one or more processors 116. Such modules 120 can store instructions, control algorithms, logic steps, and so forth.

In one or more embodiments, an interface circuit 140 is operable with one or more of the electrical connectors 112,113. The interface circuit 140 is coupled to one or more electrical contacts 142 of the electrical connectors 112,113, which in one or more embodiments have at least a portion thereof exposed to an exterior 143 of the housing 101 of the electronic device 100.

The interface circuit 140 is responsible for conducting standard operations of the connector. In one embodiment, this includes interacting with a complementary connector 144 when that complementary connector 144 is coupled to a particular connector 112,113. Illustrating by example, where the connector 113 is a headset jack, the interface circuit 140 may be operable to send and receive analog audio signals to and from a complementary 3.5-millimeter audio connector, which would be the complementary connector 144 in this application. Similarly, where the connector 112 is a mUSB connector, the interface circuit 140 can be responsible for coupling voltage and/or current and data to and from a complementary mUSB connector, which would be the complementary connector in this application.

In one or more embodiments, a moisture detection circuit 141 is coupled to at least one electrical contact 142 of the connector 112. As will be described in more detail below, in one or more embodiments the moisture detection circuit 141 is to detect moisture contacting the connector 112. In one or more embodiments, when the moisture detection circuit 141 determines that moisture is in contact with the connector 112, the moisture detection circuit 141 can cause the one or more processors 116 to execute at least one operation.

The moisture detection circuit 141 can include one or more subcomponents. For example, in one embodiment the moisture detection circuit 141 can include analog-to-digital converters (ADCs), digital-to-analog converters (DACs), filters, signal processing components, and/or control circuits. Operation of the moisture detection circuit 141 will be explained in more detail with reference to subsequent figures.

In one embodiment, the one or more processors 116 may generate commands or execute control operations based on information received from moisture detection circuit 141. The one or more processors 116 may process any information received from the moisture detection circuit 141 alone or in combination with other data, such as the information stored in the memory 118.

Figure 2:
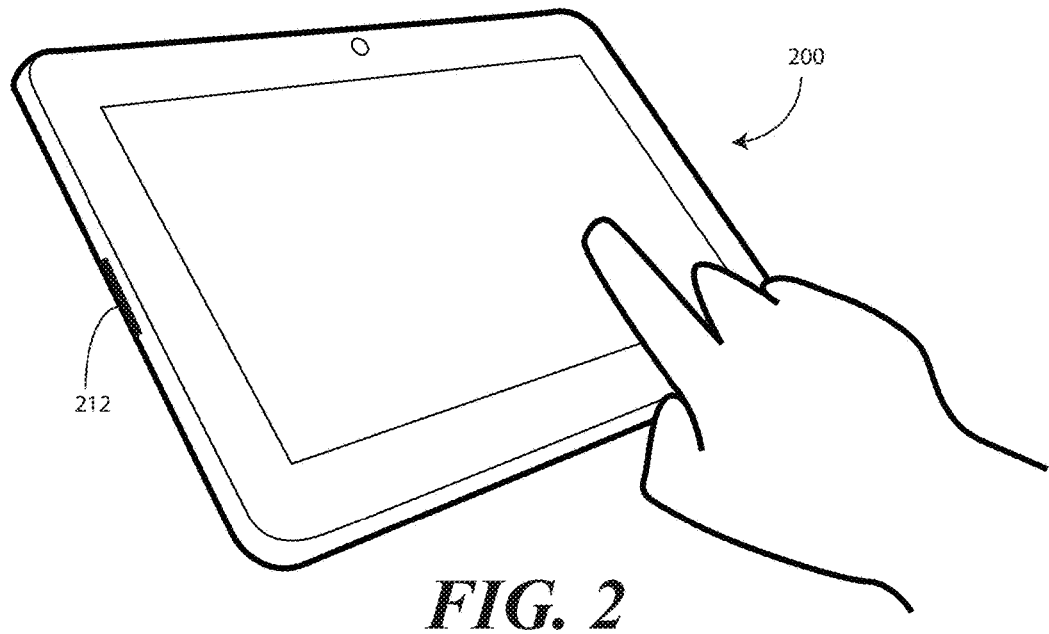
FIG. 2 illustrates an alternate electronic device in accordance with one or more embodiments of the disclosure.
Figure 3:
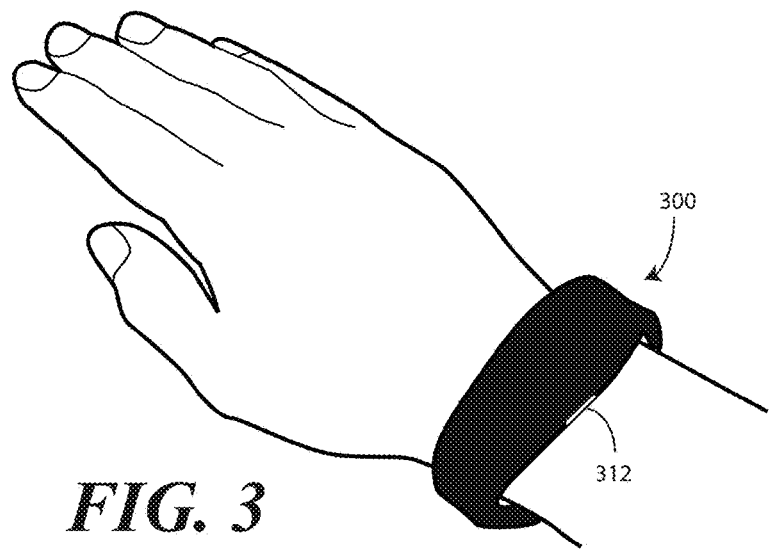
FIG. 3 illustrates another alternate electronic device in accordance with one or more embodiments of the disclosure.

As noted above, the interface circuit 140 and the moisture detection circuit 141 can be used with a wide variety of device types. Turning now to FIGS. 2 and 3, illustrated therein are just a few such examples. Beginning with FIG. 2, the electronic device 200 is a tablet computer. As shown, the electronic device 200 includes a connector 212, which in this case is a multi-pin digital and analog combination connector. In FIG. 3, the electronic device 300 is a wearable device configured as a smart watch. The electronic device 300 includes a connector 312, which in this case is a uUSB connector. The electronic devices 200,300 of FIGS. 2 and 3 are illustrative only, as others will be obvious to those of ordinary skill in the art having the benefit of this disclosure.

Figure 4:
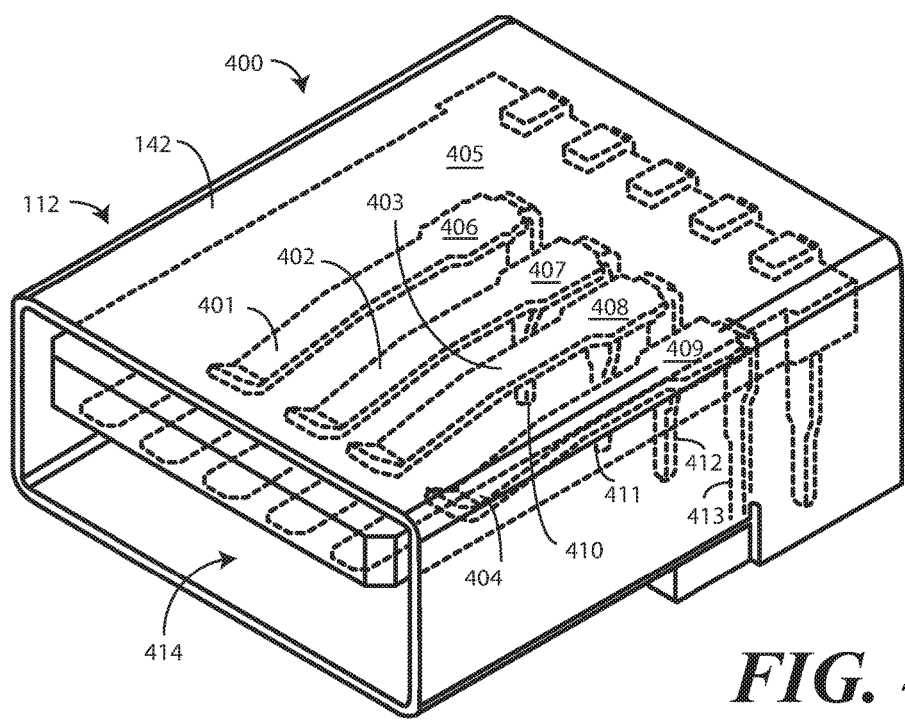
FIG. 4 illustrates an explanatory connector in accordance with one or more embodiments of the disclosure.

Turning now to FIG. 4, illustrated therein is one explanatory connector 112 in accordance with one or more embodiments of the disclosure. For illustration purposes, the explanatory connector 112 is a USB connector. However, it should be noted that embodiments of the disclosure can use the external contacts of a wide variety of connectors in a dual-function mode of both detecting moisture, when working with the moisture detection circuit (141), and their normal function, when working with the interface circuit (140). For example, other connectors include an audio connector, such as a headset jack, a data card connector, such as a secure digital (SD) memory card connector, a USB connector, a mini-USB connector, or a micro-USB connector. Additionally, other devise such as bio-mechanical sensors or biochemical sensors comprising exposed electrical contacts can be used as well. Other types of connectors or sensors will be obvious to those of ordinary skill in the art having the benefit of this disclosure.

The connector 112 includes one or more electrical contacts 142 disposed within a shroud 400. The connector 112 of FIG. 4 is a female connector for illustration purposes. However, the connector 112 could be a male connector in other embodiments.

In this illustrative embodiment, the one or more electrical contacts 142 comprise four electrical contacts 401,402,403, 404. The electrical contacts 401,402,403,404 are supported by a carrier 405, which is optional. The carrier 405 can be a circuit board, mechanical guide for a complementary connector (144), or other supporting structure.

In one embodiment, the electrical contacts 401,402,403, 404 include a first portion 406,407,408,409 and a second portion 410,411,412,413. The first portion 406,407,408,409 is exposed to an exterior (143) of a housing (101) of an electronic device (100). The second portion 410,411,412, 413 couples to circuitry components disposed interior of the housing (101), including the interface circuit (140) and the moisture detection circuit (141). In this illustrative embodiment, the electrical contacts 401,402,403,404 pass through the carrier 405, which forms a moisture barrier between the first portion 406,407,408,409 and the second portion 410, 411,412,413 of each electrical contact 401,402,403,404. Other connector types will also have interior and exterior contact portions, albeit in different configurations. In one embodiment, the first portion 406,407,408,409 is to couple to electrical contacts in a complementary connector (144).

In one embodiment, each of the electrical contacts 401, 402,403,404 is manufactured from an electrically conductive material. For example, in one embodiment the electrical contacts 401,402,403,404 are manufactured from copper. Other materials, such as gold, nickel plated steel, or gold plated copper can be used as well.

In one or more embodiments, the shroud 400 is manufactured from a conductive material as well. For example, in many embodiments the shroud 400 is intentionally conductive to provide an electromagnetic shield for the electrical contacts 401,402,403,404 disposed within the shroud 400. Using a conductive material, such as metal, for the shroud 400 can also provide mechanical stability that prevents the electrical contacts 401,402,403,404 from being damaged. It should be noted that using a conductive material for the shroud 400 is optional, as some connectors will have non-conductive housings or shrouds.

In this illustrative embodiment, the shroud 400 includes an opening 414 into which a complementary connector (144) can be inserted. When the complementary connector (144) is inserted into the shroud 400 of the connector 112, data, signals, and energy can be exchanged through the electrical contacts 401,402,403,404. Where the connector 112 is a USB connector, these data, signals, and energy can be exchanged through the electrical contacts 401,402,403, 404 in accordance with an applicable USB standard.

Figure 5:
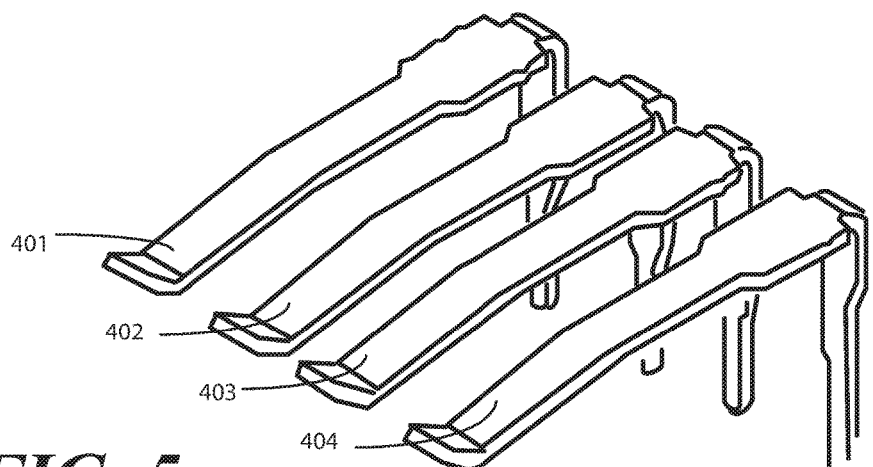
FIG. 5 illustrates explanatory electrical contacts in accordance with one or more embodiments of the disclosure.

Turning now to FIG. 5, illustrated therein are the electrical contacts 401,402,403,404 removed from the connector (112). The electrical contacts 401,402,403,404 are new and unused, and thus are in a clean and pristine state. This state is a reference for comparison to the same electrical contacts 401,402,403,404 after contamination by various liquids in FIGS. 6-8 below. To demonstrate advantages of embodiments of the present disclosure, experimental testing was performed on electrical contacts 401,402,403,404 to determine how they may be affected by exposure to various liquids without remediation.

In each experiment, a connector (112) comprising the electrical contacts 401,402,403,404 was filled with a predefined liquid and then shaken out. This process was repeated five times. The connector (112) was then filled with the predetermined liquid again, with a charger connected as a complementary device. Charging voltage and current was applied to one or more of the electrical contacts 401,402, 403,404 for ten minutes. The charger was disconnected and the connector (112) was shaken out. This procedure was repeated five times. The electrical contacts 401,402,403,404 of FIG. 5 illustrate the original condition prior to experimentation.

Figure 6:
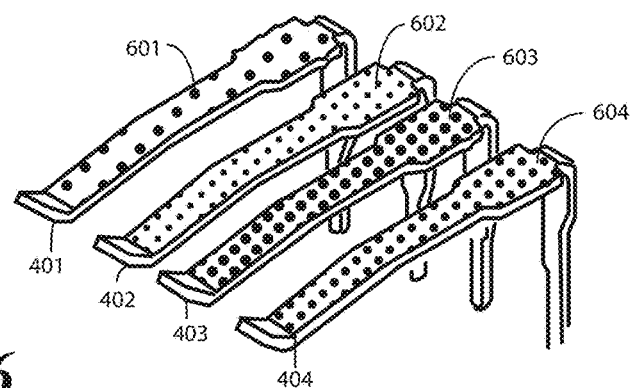
FIG. 6 illustrates explanatory electrical contacts experiencing freshwater corrosion.

Beginning with FIG. 6, in this experiment the predefined liquid was fresh water. When water was applied to the electrical contacts 401,402,403,404 without a complementary connector (144) coupled, the electronic device (100) worked normally.

The electronic device (100) to which the electrical contacts 401,402,403,404 were connected also worked normally after the first cycle of the charging test. After only two cycles of the charging test, various amounts of black corrosion 601,602,603,604 began to appear on the electrical contacts 401,402,403,404. However, after the third cycle the electronic device (100) failed to provide a charging icon on the display (102) when the complementary connector (144) of the charger was connected. Subsequent cycles increased the amounts of black corrosion 601,602,603,604 along the electrical contacts 401,402,403,404.

Figure 7:
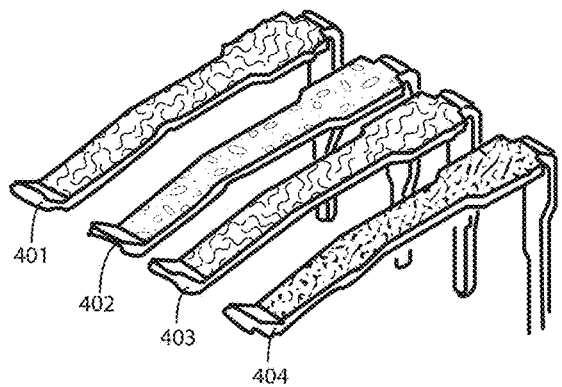
FIG. 7 illustrates explanatory electrical contacts experiencing saltwater corrosion.

Turning to FIG. 7, in this experiment the predefined liquid was saltwater. However, the saltwater experiment was to simulate "partially wet" saltwater. Accordingly, after shaking out the connector (112) in each cycle, the electrical contacts 401,402,403,404 were allowed to at least partially dry.

When water was applied to the electrical contacts 401, 402,403,404 without a complementary connector (144) coupled, the electronic device (100) worked normally. However, after only a single cycle of the charging test, the electrical contacts 401,402,403,404 began to corrode as shown. After six to seven cycles of the charging test, operation of the electrical contacts 401,402,403,404 became intermittent. After about ten cycles, operation of the connector (112) failed completely.

Figure 8:
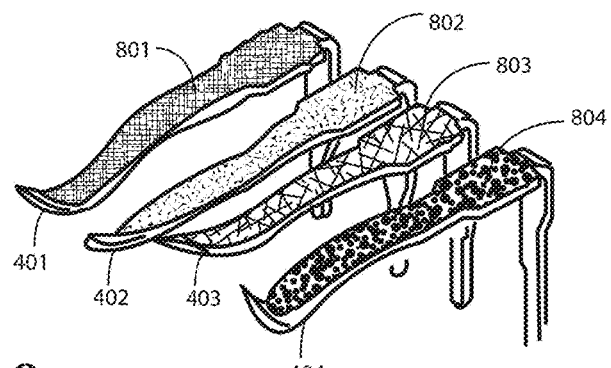
FIG. 8 illustrates explanatory electrical contacts experiencing partially wet saltwater corrosion.

Turning to FIG. 8, in this experiment the predefined liquid was wet saltwater with no dry time. When water was applied to the electrical contacts 401,402,403,404 without a complementary connector (144) coupled, the electronic device (100) worked normally.

However, after less than a single cycle of the charging test, severe corrosion 801,802,803,804 began to deform the electrical contacts 401,402,403,404 and caused them to fail immediately. The connector (112) was thus rendered useless. This occurred after charging the electronic device (100) for only two minutes in one trial.

Two things became evident from these trials: First, saltwater is far more damaging to the electrical contacts 401, 402,403,404 than fresh water. Second, the electrical contacts 401,402,403,404 were far more severely damaged when a voltage was applied to, or a current flowed through, the electrical contacts 401,402,403,404 than when they were open. Advantageously, embodiments of the present disclosure take advantage of this knowledge to detect moisture, notify a user, and optionally disable operation of the interface circuit (140) to ensure longevity of operation of connectors configured with moisture detectors as described herein.

While there are numerous advantages offered by embodiments of the present disclosure, a few distinguishing embodiments of the present disclosure from prior art systems are worthy of note here. First, embodiments of the disclosure advantageously detect liquid or moisture along portions (406,407,408,409) of electrical contacts 401,402, 403,404 that are external to the housing (101) of an electronic device (100). Many prior art systems measure moisture after it has entered the housing. Accordingly, embodiments of the present disclosure can sense the presence of moisture before it enters the housing (101), thereby reducing the probability of catastrophic damage due to non-remediation.

Next, embodiments of the present disclosure use existing electrical contacts 401,402,403,404 from an existing connector (112). Prior art designs require sensor probes and detection terminals that are separate and distinct from any connector that may be present on a device. By contrast, embodiments of the present disclosure use electrical contacts 401,402,403,404 that are already present for the dual purpose of standard connector operation and moisture detection. This advantageously reduces overall circuit complexity by eliminating the need for an additional sensor circuit.

As will be described in more detail below, in one or more embodiments the moisture detection circuit (141) only periodically checks for moisture. Consequently, the moisture detection circuit (141) is not always operational, which advantageously reduces power consumption.

Additionally, in one or more embodiments the moisture detection circuit (141) can determine not only that moisture is in disposed along the electrical contacts 401,402,403,404, but also the type of moisture. As noted above, salt water in the presence of high current or voltage is far more damaging that fresh water on inactive electrical contacts 401,402,403, 404. Accordingly, in one or more embodiments the moisture detection circuit (141) can distinguish between fresh water and saltwater. Accordingly, appropriate remediation steps can be taken depending on the particular condition of both the connector (112) and the moisture. These advantages are illustrative only, as others will be readily obvious to those of ordinary skill in the art having the benefit of this disclosure.

Figure 9:
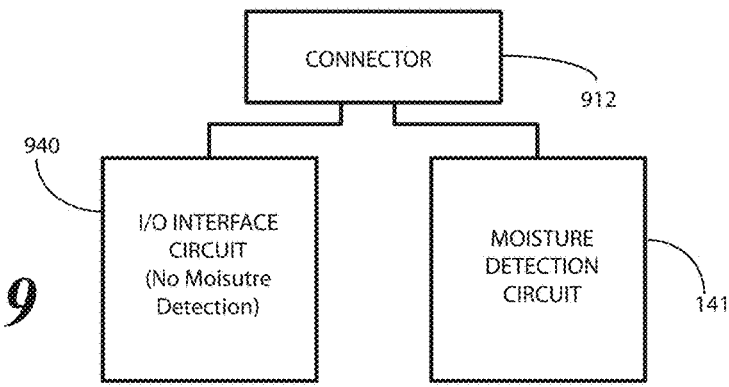
FIG. 9 illustrates one explanatory connector system in accordance with one or more embodiments of the disclosure.
Figure 10:
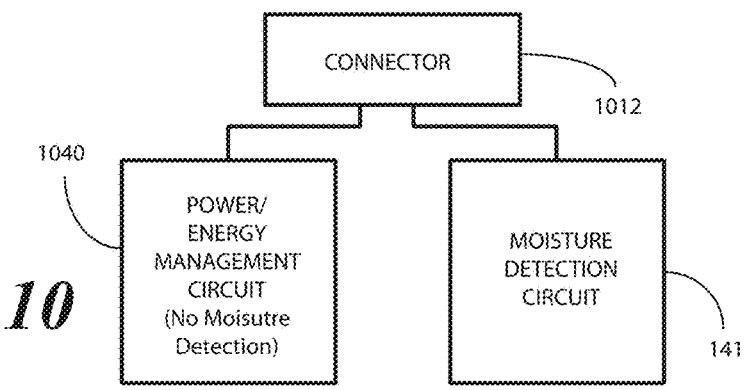
FIG. 10 illustrates another explanatory connector system in accordance with one or more embodiments of the disclosure.
Figure 11:
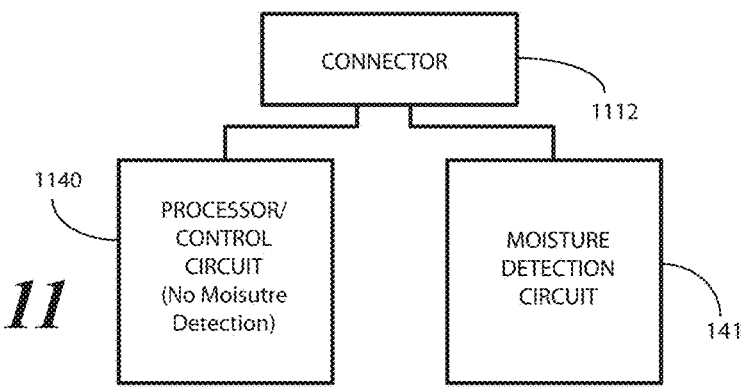
FIG. 11 illustrates yet another explanatory connector system in accordance with one or more embodiments of the disclosure.

As noted above with reference to FIG. 1, in one or more embodiments an electrical connector (112) is disposed along the housing (101) of an electronic device (100) and comprises one or a plurality of electrical contacts (142) having at least a portion (106,107,108,109) thereof exposed to an exterior (143) of the housing (101). An interface circuit (140) is operable with the electrical connector (112) and is coupled to one or more electrical contacts of the electrical connector (112) to interact with a complementary connector (144) when connected to the electrical connector (112). A moisture detection circuit (141) is to detect moisture contacting the electrical connector (112). The moisture detection circuit (141) is coupled to at least one electrical contact of the electrical connector (112). It is well to note that the interface circuit (140) can take many different forms. Turning now to FIGS. 9-11, illustrated therein are a few such examples.

Beginning with FIG. 9, illustrated therein is a connector 912 comprising one or a plurality of electrical contacts. A moisture detection circuit 141 is to detect moisture contacting the electrical connector 912 and is coupled to at least one electrical contact of the electrical connector 912.

An interface circuit 940 is operable with the electrical connector 912 and is coupled to one or more electrical contacts of the electrical connector 912 to interact with a complementary connector when connected to the electrical connector 912. In this illustrative embodiment, the connector 912 is an input/output (I/O) data connector. Accordingly, the interface circuit 940 is an I/O data circuit configured to send and receive data through the electrical contacts when the complementary connector is connected to the connector 912.

Turning now to FIG. 10, illustrated therein is another connector 1012 comprising one or a plurality of electrical contacts. A moisture detection circuit 141 is to detect moisture contacting the electrical connector 1012 and is coupled to at least one electrical contact of the electrical connector 1012.

As with FIG. 9, an interface circuit 1040 of FIG. 10 is operable with the electrical connector 1012 and is coupled to one or more electrical contacts of the electrical connector 1012 to interact with a complementary connector when connected to the electrical connector 1012. In this illustrative embodiment, the connector 1012 is a charging connector for an electronic device. Accordingly, the interface circuit 1040 is a power or energy management circuit configured to receive current from a charger or power supply when the complementary connector is connected to the connector 1012.

Turning now to FIG. 11, illustrated therein is another connector 1112 comprising one or a plurality of electrical contacts. A moisture detection circuit 141 is to detect moisture contacting the electrical connector 1112 and is coupled to at least one electrical contact of the electrical connector 1112.

As with FIGS. 9 and 10, an interface circuit 1140 is operable with the electrical connector 1112 and is coupled to one or more electrical contacts of the electrical connector 1112 to interact with a complementary connector when connected to the electrical connector 1112. In this illustrative embodiment, the connector 1112 is a data connector for an electronic device. Accordingly, the interface circuit 1140 comprises one or more processors or control circuits that can control accessory devices and/or respond to control signals received through the connector 1112. It should be noted that the various interface circuits and connectors of FIGS. 9-11 are illustrative only, as others will be obvious to those of ordinary skill in the art having the benefit of this disclosure.

Figure 12:
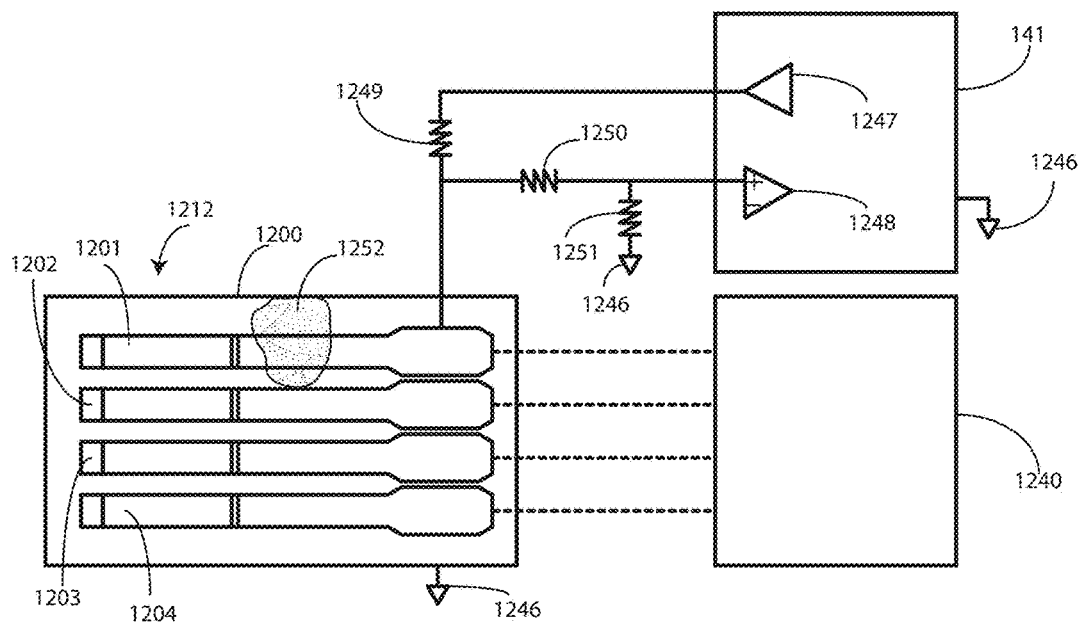
FIG. 12 illustrates another explanatory connector system in accordance with one or more embodiments of the disclosure.

Now that various illustrative configurations of embodiments of the disclosure have been described, explanatory operation of one or two variations of embodiments of the disclosure will be explored in more detail. Beginning with FIG. 12, illustrated therein is a connector 1212 comprising one or a plurality of electrical contacts 1201,1202,1203, 1204. A shroud 1200 is disposed about the electrical contacts 1201,1202,1203,1204. An interface circuit 1240 is operable with the electrical connector 1212 and is coupled to one or more electrical contacts of the electrical connector 1212 to interact with a complementary connector when connected to the electrical connector 1212.

A moisture detection circuit 141 is to detect moisture contacting the electrical connector 1212 and is coupled to at least one electrical contact of the electrical connector 1212. Here, the moisture detection circuit 141 is coupled to only a single electrical contact 1201. The single electrical contact 1201 defines a common contact to which both the interface circuit 1240 and the moisture detection circuit 141 are coupled. In one embodiment where the connector 1212 is a uUSB connector, the electrical contact 1201 is the D− contact. However, the shroud 1200 of the connector 1212 is electrically conductive and is referenced to a common node 1246 so as to function as a shield for the electrical contacts 1201,1202,1203,1204. The moisture detection circuit 141 and the shroud 1200 are coupled to the common node 1246.

In this embodiment, the moisture detection circuit 141 includes a driver 1247, which is a general-purpose input/output (GPIO) in this embodiment, and a detector 1248, which is an ADC in this embodiment. The GPIO is coupled to the electrical contact 1201 through a series resistor 1249. In one embodiment the value of this resistor is about forty-seven kilo-ohms. The GPIO serves as a driver 1247 to selectively apply a voltage to the electrical contact 1201 through the series resistor 1249.

The ADC is coupled to the electrical contact 1201 via a resistor divider of a first series resistor 1250 and a second shunt resistor 1251 to the common node 1246. In one embodiment the first series resistor 1250 is about 3.9 mega-ohms, while the second shunt resistor 1251 is about one mega-ohm. The ADC serves as a detector 1248 coupled to the electrical contact 1201 to sense a detected voltage through the resistor divider in response to the driver applying the voltage at least when moisture 1252 contacts the electrical connector 1212. The combination of the series resistor 1249 and the resistor divider function as an impedance circuit coupled between the driver and the detector.

In one or more embodiments, the GPIO applies a bias to the electrical connector 1201. The moisture detection circuit 141 in this configuration is to detect a current flowing between the electrical contact 1201 and the shroud 1200 when moisture 1252 contacts the electrical connector 1212 in response to the application of this bias.

In one or more embodiments, this bias is applied intermittently. In one or more embodiments, the bias is applied periodically. For example, in one or more embodiments the GPIO applies about a 1.8-volt bias to the electrical connector 1201 through the series resistor 1249. This voltage, when using the suggested resistor values, applies about a 0.75-volt bias to the electrical connector 1201. Experimental testing has shown that this level of bias applied to the D-contact will not affect normal operation of the interface circuit 1240 where the interface circuit 1240 is a USB interface.

In one embodiment, this bias is applied every few seconds. In other embodiments, the bias can be applied every tens of seconds. Intermittent or periodic application of the bias conserves power and reduces interference of connector operation. In one or more embodiments, the bias is applied only when a complementary connector is not coupled to the connector 1212.

For example, where the connector 1212 is a USB-type connector, the interface circuit 1240 detects whether a complementary connector is coupled to the connector 1212 by sensing voltage along one or more of the electrical contacts 1201,1202,1203,1204. Accordingly, the interface circuit 1240 can communicate with the moisture detection circuit 141 to identify when no complementary connector is coupled to the connector 1212. Advantageously, using the D− pin as the one electrical contact 1201 to which the moisture detection circuit 141 is coupled results in the interface circuit 1240 being able to detect complementary connectors while the bias is being applied to the D− pin. Where a complementary connector is coupled to the connector 1212 while the moisture detection circuit 141 is in operation, in one or more embodiments operation of the moisture detection circuit 141 can be suspended until the complementary connector is removed.

Experimental testing has shown that fresh water, when disposed in a uUSB connector, has an impedance of roughly 100 kilo-ohms when bridging the electrical connector 1201 and the shroud 1200. By contrast, saltwater has an impedance of about two kilo-ohms in the same location. By detecting the voltage at the electrical contact 1201 through the resistor divider, the ADC can determine not only whether moisture 1252 is present in the connector 1212, but also what type of liquid the moisture 1252 is. Experimental testing has shown that when moisture 1252 is present the 0.75-volt bias that is applied when the electrical contact 1201 is dry can be reduced to as little as 0.071 volts, which is readily detectable by the detector 1248.

Figure 13:
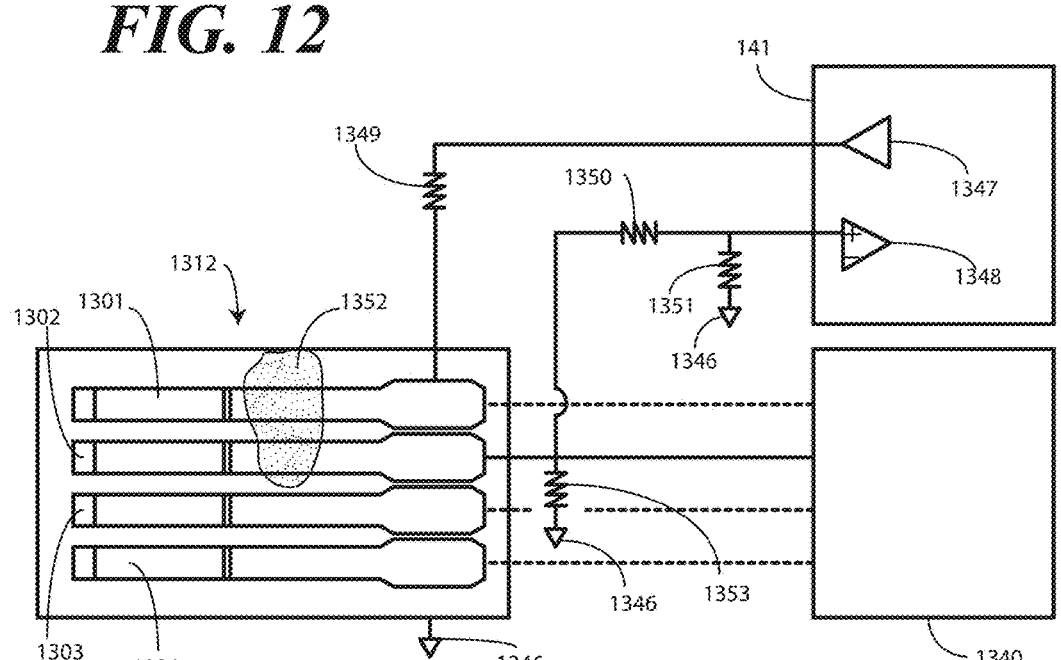
FIG. 13 illustrates yet another explanatory connector system in accordance with one or more embodiments of the disclosure.

Turning now to FIG. 13, illustrated therein is another circuit configured in accordance with one or more embodiments of the disclosure. As with FIG. 12, a connector 1312 comprising one or a plurality of electrical contacts 1301, 1302,1303,1304. An interface circuit 1340 is operable with the electrical connector 1312 and is coupled to one or more electrical contacts of the electrical connector 1312 to interact with a complementary connector when connected to the electrical connector 1312.

A moisture detection circuit 141 is to detect moisture contacting the electrical connector 1312 and is coupled to at least one electrical contact of the electrical connector 1312. Here, in contrast to FIG. 12, the moisture detection circuit 141 is coupled to two electrical contacts 1301,1302. In one embodiment where the connector 1312 is a USB connector, the first electrical contact 1301 is the D− contact and the second electrical contact 1302 is the VBUS contact. In one embodiment, the moisture detection circuit 141 is to detect a current flowing between the two electrical contacts 1301, 1302 when the moisture 1352 contacts the electrical connector 1312.

The driver 1347 is coupled to electrical contact 1301 through a series resistor 1349. In one embodiment the value of this resistor is about forty-seven kilo-ohms. The driver 1347 applies a voltage to the electrical contact 1301 through the series resistor 1349.

The detector 1348 is coupled to the electrical contact 1301 via a resistor divider of a first series resistor 1350 and a second shunt resistor 1351 to the common node 1346. In one embodiment the first series resistor 1350 is about 3.9 mega-ohms, while the second shunt resistor 1351 is about one mega-ohm. An additional pull-down resistor 1353 of about forty-seven kilo-ohms is coupled to electrical contact 1302 as well. The detector 1348 is to sense a detected voltage through the resistor divider in response to the driver 1347 applying the voltage at least when moisture 1352 contacts the electrical connector 1312 as previously described.

For example, in one or more embodiments the driver 1347 applies about a 1.8-volt bias to the electrical contact 1301 through the series resistor 1349. Where no moisture 1352 is present, i.e., when the moisture 1352 is not in contact with the connector 1312, the impedance circuit defined by the series resistor 1349 and the resistor divider is an open circuit. However, when the moisture 1352 is present, the detector 1348 senses a positive voltage indicating the presence of moisture 1352.

In one embodiment, this bias is applied every few seconds. In other embodiments, the bias can be applied every tens of seconds. Intermittent or periodic application of the bias conserves power and reduces interference of connector operation. In one or more embodiments, the bias is applied only when a complementary connector is not coupled to the connector 1312 as previously described.

Figure 14:
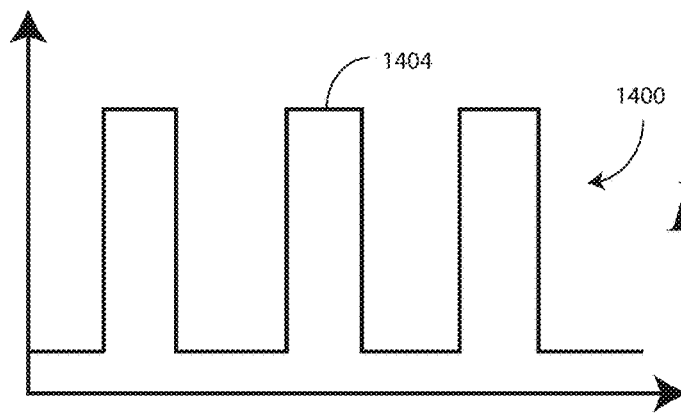
FIGS. 14-16 illustrate explanatory signal diagrams in accordance with one or more embodiments of the disclosure.
Figure 15:
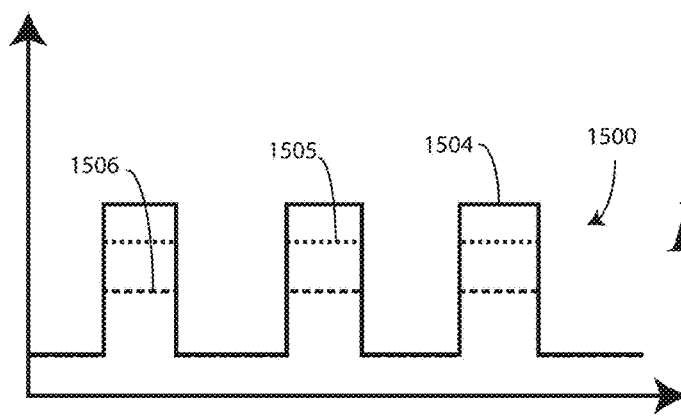
Figure 16:
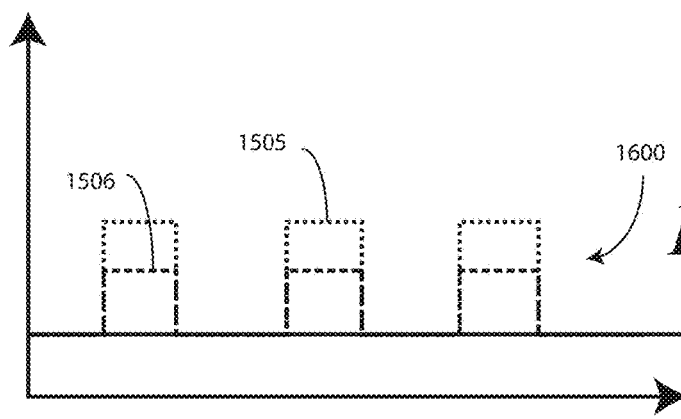

Turning now to FIGS. 14-16, illustrated therein are explanatory driver and detector voltages corresponding to the circuits of FIGS. 12 and 13. The waveform 1400 of FIG. 14 illustrates the bias applied by the driver (1247,1347) of either circuit. In one embodiment, this bias is a 1.8-volt bias applied periodically. For example, the driver (1247,1347) can apply the voltage 1404 every ten to fifteen seconds. In one or more embodiments, the voltage 1404 is applied only when a complementary connector is not coupled to the connector (1212,1312).

The waveforms 1500 of FIG. 15 illustrate detected voltages 1504,1505,1506 that can be sensed by the detector (1248) of FIG. 12. As noted above, in one embodiment the driver (1247) is to periodically apply the voltage (1204) to at least one electrical contact (1201) of the connector (1212). The detector (1248) is then to sense a detected voltage in response to the driver (1247) applying the voltage (1204). When moisture (1252) contacts the electrical connector (1212), the voltage 1505,1506 will be less than the voltage 1504 detected when moisture (1252) is not present. Additionally, whether the moisture (1252) is saltwater or freshwater will affect the voltage sensed. Where the moisture (1252) is fresh water, the detected voltage 1505 will be higher than is the detected voltage 1506 when the moisture (1252) is saltwater.

Said differently, the detector (1248) will sense another detected voltage, i.e., voltage 1504, when the moisture (1252) is not in contact with the electrical connector (1212). This voltage 1504 will be greater than the detected voltage, i.e., voltage 1505 or voltage 1506, when the moisture (1252) is present. When moisture (1252) is present, the voltage detected can identify the type of moisture as the detected voltage will comprise a first voltage 1506 when the moisture (1252) comprises salt water and a second voltage 1505 when the moisture (1252) comprises fresh water, where the first voltage 1306 is less than the second voltage 1305.

The waveforms 1600 of FIG. 16 correspond to the circuit of FIG. 13, and are similar to the waveforms (1500) of FIG. 15 with one exception. Since the driver (1347) and detector (1348) are coupled to different electrical contacts (1301, 1302), when no moisture (1352) is present and the resistor divider is tied to the common node 1346, the detector (1348) will detect no voltage 1604. Otherwise, the detected voltages 1505,1506 will be detected as described with reference to FIG. 15 above.

Regardless of how moisture is detected, its detection is beneficial. Embodiments of the disclosure use this information in different ways. Turning now back to FIG. 1, a few examples will be illustrated. Others will be obvious to those of ordinary skill in the art having the benefit of this disclosure.

In one embodiment, the one or more processors 116 of the electronic device 100 are operable with the moisture detection circuit 141. In one embodiment the one or more processors 116 are to execute at least one operation when the moisture detection circuit 141 detects the moisture contacting the electrical connector 112. For example, the at least one operation can comprise delivering a moisture detection notification to a user interface 111 of the electronic device 100.

Figure 17:
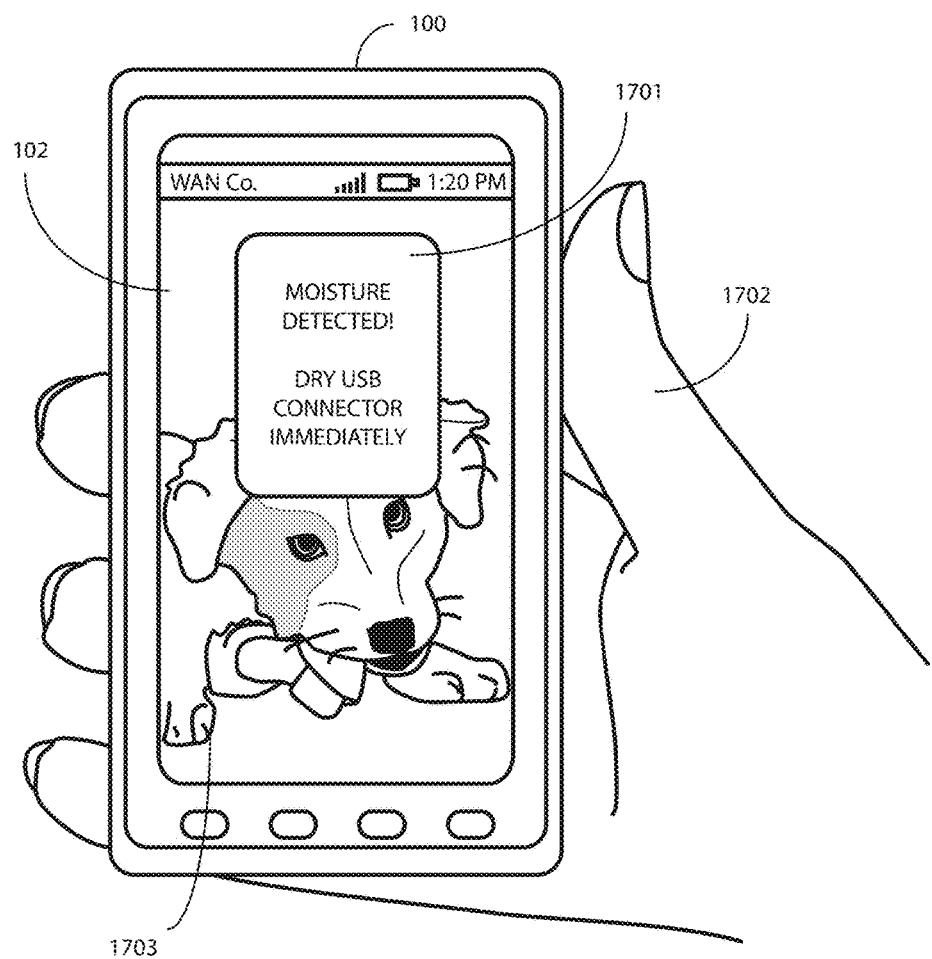
FIG. 17 illustrates an explanatory alert notification in accordance with one or more embodiments of the disclosure.

Turning briefly to FIG. 17, one such moisture detection notification 1701 is shown. A user 1702 is holding the electronic device 100 and is looking at a picture of her dog 1703, Buster. For any number of reasons, rain, perspiration, etc., moisture has come in contact with the connector (112). Accordingly, the one or more processors (116) deliver the moisture detection notification 1701 on the display 102 to notify the user 1702 of this concern. The user 1702 can then address the issue by shaking out the moisture or other remediating the issue. In one or more embodiments, the delivery of moisture detection notifications 1701 is user selectable and can be turned OFF as desired.

Turning back to FIG. 1, there are other actions that the one or more processors 116 can take. In one embodiment, the one or more processors 116 suspend interface circuit interaction with the complementary connector 144. Recall from above that corrosion and other damage to the electrical contacts 142 is exacerbated when current or voltage is applied thereto. Accordingly, in one embodiment the one or more processors 116 cause the interface circuit 140 to suspend operation with any complementary connector 144 that may be coupled to the connector 112.

In yet another embodiment, the one or more processors can record an occurrence 145 of moisture detection in the memory 118 of the electronic device 100. This occurrence 145 can assist technicians with the repair of the electronic device 100 or with warranty determinations. As noted above, other operations in response to moisture detection will be obvious to those of ordinary skill in the art.

Figure 18:
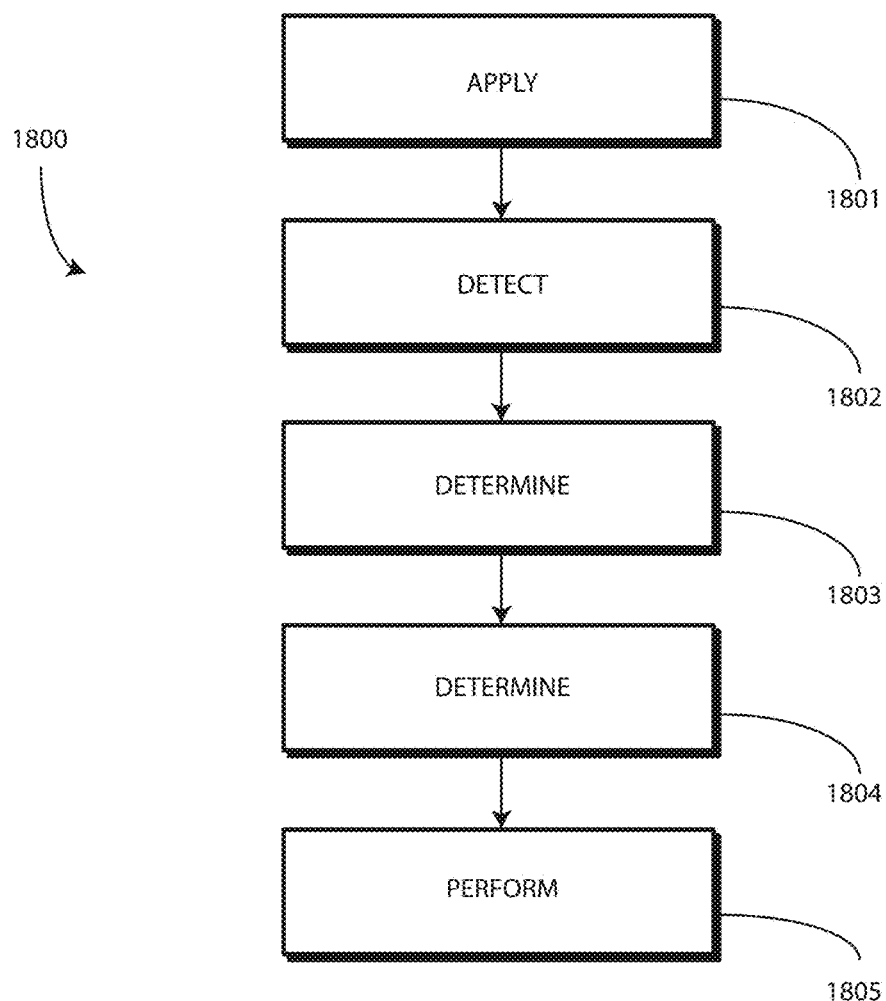
FIG. 18 illustrates an explanatory method in accordance with one or more embodiments of the disclosure.

Turning now to FIG. 18, illustrated therein is a method 1800 in accordance with one or more embodiments of the disclosure. Many of the method steps have been described with reference to the figures above, and will only be briefly described here.

At step 1801, the method 1800 selectively applies, with a moisture detection circuit, a voltage to one or more electrical contacts of a connector operable with, and coupled to, an interface circuit. In one or more embodiments, at least a portion of the one or more electrical contacts is exposed to an exterior of the electronic device.

At step 1802, the method 1800 detects, with the moisture detection circuit, a detected voltage in response to the selectively applying occurring at step 1801. At step 1803, the method 1800 determines, with the moisture detection circuit from the detected voltage, whether moisture is contacting the one or more electrical contacts.

At step 1804, the method 1800 optionally determines, where the moisture is contacting the one or more electrical contacts, whether the moisture comprises salt water or fresh water. At step 1805, the method optionally performs, with one or more processors of the electronic device, an operation in response to determining the moisture is contacting the one or more electrical contacts.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. An electronic device, comprising:
   a housing;
   an electrical connector disposed along the housing and comprising one or a plurality of electrical contacts having at least a portion thereof exposed to an exterior of the housing;
   an interface circuit operable with the electrical connector and coupled to one or more electrical contacts of the electrical connector, the interface circuit interacting with a complementary connector when connected to the electrical connector; and
   a moisture detection circuit detecting moisture contacting the electrical connector, the moisture detection circuit coupled to at least one electrical contact of the electrical connector;
   the electrical connector further comprising a shroud disposed about the one or the plurality of electrical contacts, the moisture detection circuit and the shroud coupled to a common node, the moisture detection circuit detecting a current flowing between the at least one electrical contact and the shroud when the moisture contacts the electrical connector.

2. The electronic device of claim 1, wherein the at least one electrical contact and the electrical connector are a common contact to which both the interface circuit and the moisture detection circuit are coupled.

3. The electronic device of claim 2, the moisture detection circuit comprising a detector coupled to the common contact via a resistor divider.

4. The electronic device of claim 1, the moisture detection circuit comprising a driver to selectively apply a voltage to the at least one electrical contact.

5. The electronic device of claim 4, the driver to periodically apply the voltage to the at least one electrical contact.

6. The electronic device of claim 4, the moisture detection circuit further comprising a detector coupled to the at least one electrical contact, the detector to sense a detected voltage in response to the driver applying the voltage at least when the moisture contacts the electrical connector.

7. The electronic device of claim 6, further comprising an impedance circuit coupled between the driver and the detector.

8. The electronic device of claim 7, the detector further to sense another detected voltage when the moisture is not in contact with the electrical connector, the another detected voltage greater than the detected voltage.

9. The electronic device of claim 7, the detected voltage comprising a first voltage when the moisture comprises salt water and a second voltage when the moisture comprises fresh water, the first voltage less than the second voltage.

10. The electronic device of claim 7, the impedance circuit defining an open circuit when the moisture is not in contact with the electrical connector.

11. The electronic device of claim 1, further comprising one or more processors operable with the moisture detection circuit, the one or more processors to execute at least one operation when the moisture detector detects the moisture contacting the electrical connector.

12. The electronic device of claim 11, the at least one operation comprising delivering a moisture detection notification to a user interface of the electronic device.

13. The electronic device of claim 11, the at least one operation comprising suspending interface circuit interaction with the complementary connector.

14. The electronic device of claim 11, the at least one operation comprising recording an occurrence of moisture detection in a memory device of the electronic device.

15. The electronic device of claim 1, wherein the at least one electrical contact and the one or more electrical contacts comprise a common contact, further comprising a driver to selectively apply a voltage to the at least one electrical contact while the interface circuit is operational at the common contact.

16. The electronic device of claim 15, wherein the common contact comprises a single contact, wherein the single contact comprises a D-pin of a USB connector, wherein the voltage is less than one volt.

17. The electronic device of claim 1, the electrical connector comprising one of an audio connector, a data card connector, a secure digital (SD) memory card connector, a universal serial bus (USB) connector, a mini-USB connector, or a micro-USB connector.

18. A method in an electronic device, comprising:

selectively applying, with a moisture detection circuit, a voltage to one or more electrical contacts of a connector operable with, and coupled to, an interface circuit, wherein at least a portion of the one or more electrical contacts is exposed to an exterior of the electronic device, wherein the connector comprises a shroud disposed about the one or more electrical contacts with the moisture detection circuit and the shroud coupled to a common node;

detecting, with the moisture detection circuit, a current flowing between the one or more electrical contacts and the shroud in response to the selectively applying when moisture contacts the electrical connector; and determining, with the moisture detection circuit from the current that moisture is contacting the one or more electrical contacts.

19. The method of claim 18, the determining further comprising also determining, where the moisture is contacting the one or more electrical contacts, whether the moisture comprises salt water or fresh water.

20. The method of claim 19, further comprising performing, with one or more processors of the electronic device, an operation in response to determining the moisture is contacting the one or more electrical contacts.

* * * * *